(12) United States Patent
Hopkins

(10) Patent No.: US 7,731,922 B2
(45) Date of Patent: *Jun. 8, 2010

(54) APPARATUS AND METHOD FOR CLEANING, NEUTRALIZING CARBON MONOXIDE AND RECIRCULATING EXHAUST AIR IN A CONFINED ENVIRONMENT

(76) Inventor: Danny L. Hopkins, 7443 S. Marion St., Centennial, CO (US) 80122

( * ) Notice: Subject to any disclaimer, the term of this patent is extended or adjusted under 35 U.S.C. 154(b) by 521 days.

This patent is subject to a terminal disclaimer.

(21) Appl. No.: 11/824,405

(22) Filed: Jun. 29, 2007

(65) Prior Publication Data
US 2007/0253873 A1    Nov. 1, 2007

Related U.S. Application Data

(60) Continuation of application No. 10/661,214, filed on Sep. 12, 2003, now Pat. No. 7,252,807, which is a division of application No. 09/873,635, filed on Jun. 4, 2001, now Pat. No. 6,797,247, which is a continuation-in-part of application No. 09/399,125, filed on Sep. 20, 1999, now Pat. No. 6,241,809.

(51) Int. Cl.
*B01D 47/00* (2006.01)
*B01D 53/56* (2006.01)
(52) U.S. Cl. ...................... 423/210; 423/245.3; 423/247
(58) Field of Classification Search ................. 423/210, 423/245.3, 247; 422/177, 180
See application file for complete search history.

(56) References Cited

U.S. PATENT DOCUMENTS

| 3,049,399 | A | 8/1962 | Gamson et al. |
| 3,802,158 | A | 4/1974 | Ohle |
| 4,350,504 | A | 9/1982 | Diachuk |

*Primary Examiner*—Tom Duong
(74) *Attorney, Agent, or Firm*—John R. Ley

(57) ABSTRACT

Exhaust air containing particulate and carbon monoxide gas contaminants is withdrawn from a confined environment, such as a food cooking area, by a circulation system which liquid scrubs particulate contaminants from the exhaust flow, removes liquid mist from the flow, and then catalyzes or neutralizes the carbon monoxide gas contaminants into benign carbon dioxide before discharging the flow back into the confined environment. Removing contaminants in this manner allows a substantial amount of the thermal energy content of the exhaust air to be saved and reused within the confined environment, rather than discharging the thermal energy into the ambient environment.

4 Claims, 11 Drawing Sheets

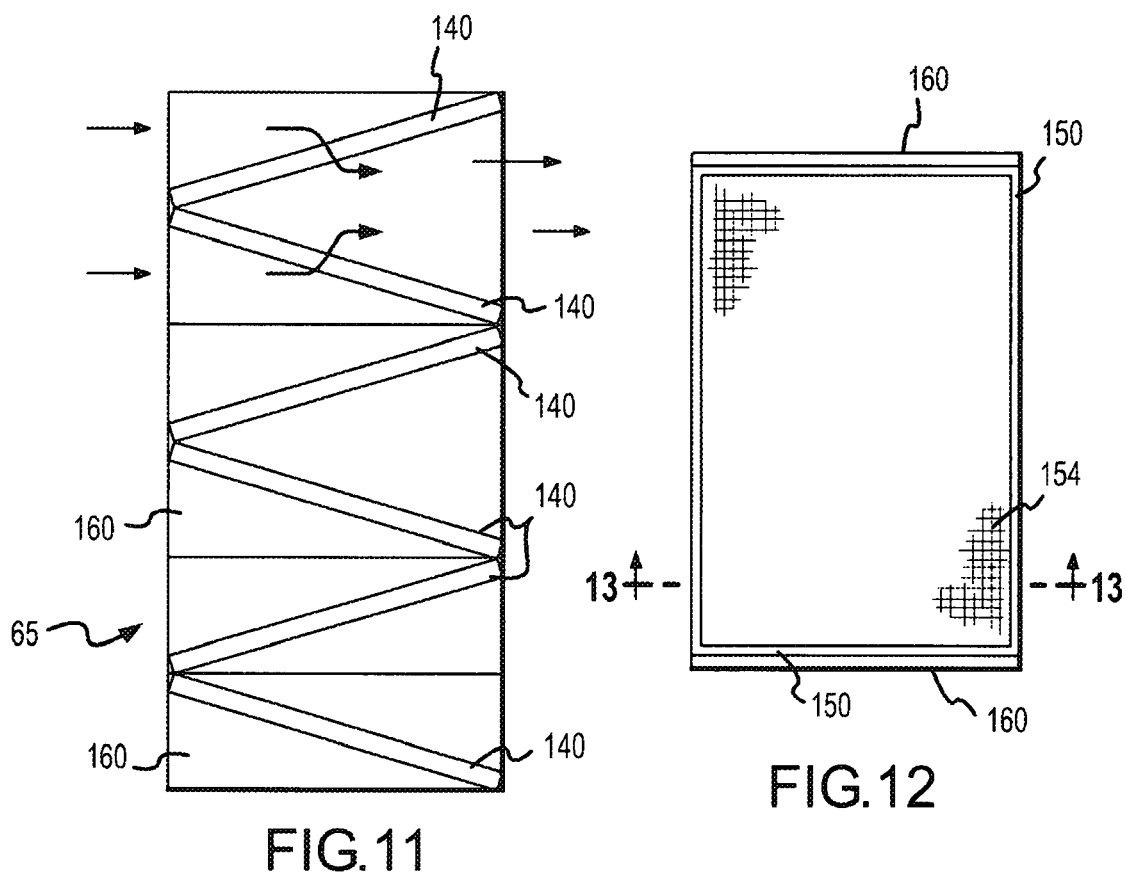
FIG.11
FIG.12
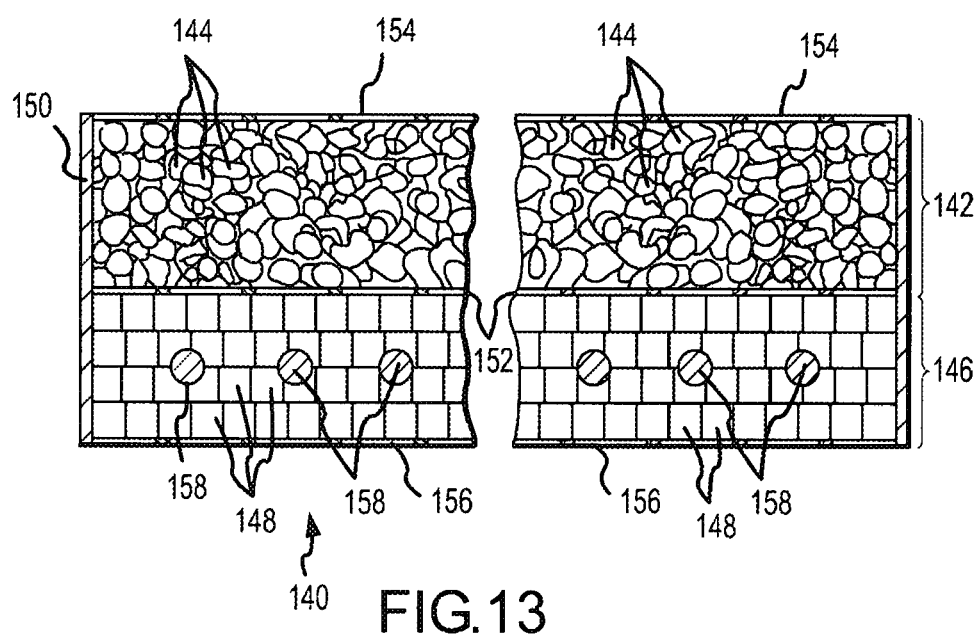
FIG.13

APPARATUS AND METHOD FOR CLEANING, NEUTRALIZING CARBON MONOXIDE AND RECIRCULATING EXHAUST AIR IN A CONFINED ENVIRONMENT

CROSS-REFERENCE TO RELATED INVENTIONS

This is a continuation of U.S. patent application Ser. No. 10/661,214, filed Sep. 12, 2003, now U.S. Pat. No. 7,252,807, issued Aug. 7, 2007; which is a division of U.S. application Ser. No. 09/873,635, filed Jun. 4, 2001, now U.S. Pat. No. 6,797,247, issued Sep. 28, 2004; which is a continuation-in-part of U.S. patent application Ser. No. 09/399,125, filed Sep. 20, 1999, now U.S. Pat. No. 6,241,809, issued Jun. 5, 2001. The disclosures of these inventions are incorporated herein by this reference.

INTRODUCTION

This invention relates to a new and improved method and apparatus which eliminates offensive and toxic particulate and gaseous contaminants, such as smoke, grease, volatile organic compounds, carbon monoxide and other toxic gases, from an exhaust flow, and recirculating the cleaned and benign exhaust flow back into a confined environment from which the exhaust originated. In addition to avoiding the discharge of undesirable and potentially harmful contaminants into the ambient environment, recirculating the cleaned and benign exhaust flow saves a substantial portion of the thermal energy of the air from the exhaust flow that would otherwise be lost by discharging the exhaust flow into the ambient environment. Thus, the present invention substantially reduces the cost of heating, cooling or otherwise conditioning makeup air to replace the conditioned air which is normally lost in an exhaust flow discharged into the ambient environment.

BACKGROUND OF THE INVENTION

Modern environmental concerns and regulations impose significant requirements for removing contaminants and undesirable constituents from the exhaust flow discharged into the ambient environment from industrial and other commercial operations. In some cases, the discharged exhaust flow must be cleaned or otherwise conditioned before it may it is discharged. For example, food preparation establishments are now required, or will soon be required, to remove the relatively high concentrations of smoke and fat airborne contaminants from the cooking exhaust. Not only is smoke generated while cooking the food, but particulate matter such as grease and fat and volatile contaminants such as odor are also created. Moreover, the hydrocarbon fuels which are burned while cooking the food generate carbon monoxide, which is toxic and may be lethal in concentrated doses. Other examples of business and industrial operations which generate exhaust with offensive and toxic particulate and gaseous contaminants are automobile repair shops, clothes drycleaning operations, and waste and water treatment plants.

Industrial and business operations frequently discharge the exhaust flow from the confined interior environment of the establishment into the ambient environment outside of the establishment. Usually the exhaust consists not only of the smoke, odor, particulates, volatile organic compounds, carbon monoxide and other toxic gases, but also air drawn from within the confined environment of the establishment which is used to carry these contaminants outside of the establishment and into the ambient environment. Some types of these industrial and business operations, such as restaurants or food preparation establishments, generate a relatively large amount of such contaminants, and the amount of air consumed from within the confined environment to exhaust the contaminants is substantial. Makeup air must be admitted into the confined environment of the establishment to replace the air consumed by the exhaust flow.

The amount of makeup air required to replace the air of the exhaust flow is usually a significant portion of the overall air required to condition the interior confined environment of the establishment. Because the interior air used in the exhaust flow is drawn from the heated, cooled or otherwise conditioned air or within the interior confined environment, the makeup air admitted into the confined environment to replace the exhaust air flow must also be heated, cooled or otherwise conditioned. Otherwise, the desired thermal environment within the establishment could not be maintained. Of course, the thermal energy content of the air within the exhaust flow is when the exhaust flow is discharged into the ambient environment.

The energy required to heat, cool or otherwise condition makeup air may be a significant operating cost of the establishment. For example, the size and energy consumption of the heating and cooling equipment required to condition the makeup air for a small fast food restaurant is approximately four times the size and capacity that would be otherwise required if air was not withdrawn from within the interior of the confined environment as part of the cooking exhaust flow into the ambient environment. Considerable expense is involved in obtaining the increased capacity of the heating and cooling equipment for conditioning the makeup air, and in operating that equipment.

One of the significant drawbacks to recirculating the exhaust air from confined environments such as food preparation establishments, has been an inability to clean the contaminants from the exhaust air in a cost-efficient manner. The previous invention referenced above offers a relatively low cost and highly effective solution of ridding the exhaust air of particulate and gaseous contaminants, thus offering the possibility of recirculating the cleaned and benign exhaust flow back into the confined environment.

It is with respect to these and other considerations that the present invention has evolved.

SUMMARY OF THE INVENTION

One primary improvement available from the present invention is an improved capability to remove offensive and harmful particulate and gaseous contaminants from an exhaust flow, and to convert toxic carbon monoxide gaseous contaminants of the exhaust flow into neutralized or benign non-toxic carbon dioxide components, thereby allowing the cleaned and neutralized exhaust flow to be recirculated back into a confined environment of a commercial or industrial establishment. Another improvement relates to recirculating a significant portion of the cleaned and benign exhaust flow to avoid losing the energy content of the conditioned air which is part of the exhaust flow. Another improvement relates to reducing the capacity of the heating, cooling and air conditioning equipment and reducing the cost of operating that equipment to condition makeup air to compensate for the air consumed by the exhaust flow. The operating costs of a food preparation establishment, or any other type of industrial or commercial establishment are substantially reduced.

These and other improvements are achieved in a recirculation system for retaining substantial thermal energy content of air drawn from within a confined environment in which offensive and toxic particulate and gaseous contaminants are generated. The recirculation system includes a collector device located within the confined environment to receive and establish a flow of the exhaust contaminants and air from within the confined environment, and a cleaner device connected to receive the flow of the exhaust contaminants and air from the exhaust collector device. The cleaner device comprises a scrubber module, a liquid removal module and a filtering and conversion module through which the exhaust flow passes. The scrubber module may include flow passageways through which the flow of exhaust contaminants and air passes and into which cleaning liquid is distributed for mixture with and entrainment of the particulate contaminants of the flow. The liquid removal module removes the cleaning liquid from the flow from the scrubber module. The filtering and conversion module includes an odor-removing filter for removing odor from the exhaust flow from the liquid removal module. The filtering and conversion module also includes a room-temperature catalyst which facilitates conversion of toxic carbon monoxide gaseous contaminants in the exhaust flow from the liquid removal module into benign carbon monoxide constituents. A delivery device is located within the confined environment to receive the cleaned and neutralized flow from the cleaner device and to discharge the flow into the confined environment.

Other useful aspects of the recirculation system include an exhaust collection hood located over the source of the exhaust and into which the cleaned and benign flow from the cleaner may be discharged. A heater may periodically heat the room-temperature catalyst to a predetermined temperature greater than room temperature sufficient to regenerate the catalytic characteristics of the catalyst. The filtering and conversion module may include a layer of particles of the room-temperature catalyst and a layer of carbon particles, and the heater may be positioned within the layer of catalyst particles. The scrubber module may include a baffle-defining structure comprising a plurality of vertically spaced and interdigitated deflection plates which define a serpentine-shaped flow passageway through which the flow of the exhaust contaminants and the air move, and one or more liquid distributors positioned within each passageway to flow liquid cleaning agent into the exhaust flow. The liquid removal device may comprise a curved sidewall structure along which the flow moves in a curved motion to force liquid remaining in the flow from the scrubber module to coalesce into liquid and drain along the sidewall structure, and to cause contaminants in the flow to be forced against the sidewall structure and become entrained in the liquid.

The above noted and other improvements are also achieved by a method of recirculating air to retain substantial thermal energy content of the air drawn from within a confined environment of an establishment which generates offensive and harmful particulate and gaseous constituents as exhaust contaminants. The method includes establishing a flow of the exhaust contaminants and air from within the confined environment, liquid scrubbing particulate contaminants from the flow, moving the flow in a curved path to force liquid mist to coalesce into liquid by centrifugal force caused by moving the flow in the curved path, removing the coalesced liquid from the flow, removing odor from the flow after the coalesced liquid has been removed, catalyzing toxic carbon monoxide remaining in the flow into benign carbon dioxide after the coalesced liquid has been removed, and discharging the cleaned and neutralized flow into the confined environment.

Other useful aspects of the method include catalyzing the toxic carbon monoxide into benign carbon dioxide at approximately room temperature, and periodically heating the catalyst to a predetermined temperature greater than room temperature to regenerate the catalytic characteristics of the catalyst. Still other useful aspects involve performing the method in a food preparation establishment having an open flame cooker which produces carbon monoxide gas and odor as gaseous contaminants and smoke and airborne grease as particulate contaminants.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIG. 11 is an enlarged elevational and vertical section view of a group of catalytic cells of the filtering and conversion module of the cleaner shown in FIG. 3.

FIG. 12 is an enlarged atop view of one catalytic cell of the filtering and conversion module shown in FIG. 11.

FIG. 13 is an enlarged vertical section view of the catalytic cell shown in FIG. 12, taken substantially in the plane of line 13-13.

DETAILED DESCRIPTION

Figure 1:
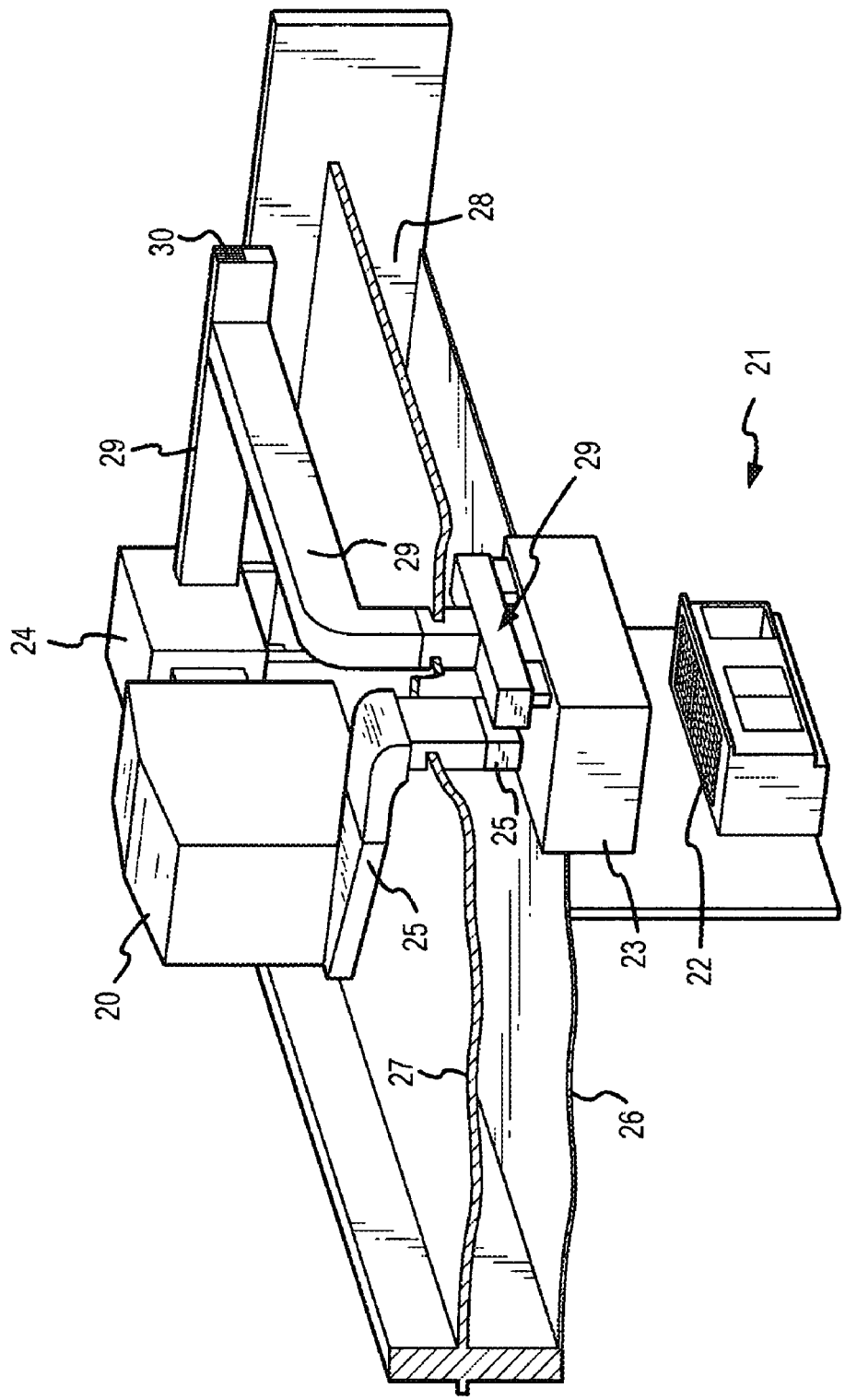
FIG. 1 is a partial perspective view of a confined environment of a food preparation establishment, as one typical application of the present invention, in which a roof-mounted exhaust cleaner and exhaust recirculation system incorporating the present invention are also shown.

A cleaner 20 embodying part of the present invention is shown in FIG. 1. The cleaner 20 is shown in a typical or exemplary use in a restaurant cooking-exhaust cleaning and recirculating application. However, the use of the invention is not limited to food preparation establishments, but may be used in any confined environment in which a variety of different types of contaminants are created and from which those contaminants must be exhausted in a flow of air. Examples of other business and industrial establishments where the present invention is particularly useful are automobile repair shops, clothes dry cleaning operations, waste and water treatment plants. The contaminants may be any airborne particulate matter of solid or liquid substances or may be molecules of hazardous gaseous substances. For example, in the restaurant cooking-exhaust cleaning application, the contaminants may include grease and fat particles, smoke, volatile organic compounds, carbon monoxide and/or other particulates and gases creating undesirable odors, smoke and harmful constituents. The confined environment of the business or industrial concern in which the present invention may be used, is intended to refer to a defined internal environment. A confined environment includes the circumstance where there is some natural entrance and loss of air within the confined environment, such as would occur when doors to the confined environment are opened or closed, or as a result of normal internal air circulation. In this sense, the confined environment does not necessarily mean an environment that is entirely closed, although an entirely closed environment would also be considered as a confined environment.

The cleaner 20 is effective in removing substantially all of the particulate contaminants and is effective in converting the hazardous gaseous substances into benign substances, so that a substantial portion of the exhaust flow may be recirculated into the confined environment. As a result of recirculating the cleaned and neutralized exhaust flow into the confined environment, there is a reduced need for heating and cooling equipment to condition makeup air to replace the air consumed by the exhaust flow, and the costs associated with operating the reduced-capacity heating and cooling equipment are also reduced.

In the exemplary cooking-exhaust cleaning and recirculating use shown in FIG. 1, the restaurant or other food preparation establishment has a food preparation area 21, including a counter-top cooker 22 such as a stove top, a range, an oven, a wood-burning oven, an open broiler, a deep fryer or other cooking device which is fueled by a hydrocarbon fuel source, such as natural gas or propane. Heat from the counter-top cooker 22 is developed by burning the hydrocarbon fuel in an open flame. The exhaust from the combusted fuel contains carbon monoxide gas, which is toxic and can be lethal in substantial doses. A collector device such as a hood 23 is located above the counter-top cooker 22 to receive and collect the cooking gas exhaust generated from the cooker 22. The cooker 22 is the source of the exhaust contaminants. The exhaust received by the hood 23 is removed from the food preparation area 21 as a result of a blower 24 drawing an air from within the confined environment of the food preparation area 21 through the hood 23. The withdrawn air lifts and otherwise transports the contaminants generated by the cooker 22 out of the confined environment.

The mixture of the withdrawn air and the contaminants forms an exhaust flow which is passed from the hood 23 and through a connecting exhaust duct 25 to the cleaner 20. The duct 25 channels the exhaust flow from the hood 23 through a ceiling 26 and a roof 27 and into the cleaner 20, which may be mounted on the roof 27. Alternatively, the cleaner 20 could be mounted in a space 28 between the ceiling 26 and the roof 27, if there is sufficient space, or on the floor of an adjacent room. The blower 30 may be any other type of blower that can produce the necessary static pressure (suction) and flow rate for the cleaner 20.

The particulate and hazardous gaseous contaminants from the cooking exhaust are cleaned from the exhaust flow and neutralized when the exhaust flow passes through the cleaner 20. The cleaned and neutralized air is passed from the cleaner 20 into the blower 24, and is discharged from the blower 24 into a recirculation duct 29. A substantial majority of the cleaned and neutralized air from the cleaner 20 is discharged as return air from the recirculation duct 29 or other delivery device into the confined environment of the establishment or into the food preparation area 22, to establish a loop recirculation path from the hood 23 through the cleaner 20 and back into the interior of the confined environment of the food preparation establishment. Since the exhaust air is cleaned and neutralized by the cleaner 20, it is practical and desirable to return the cleaned and neutralized air to the environment from which it was removed. Returning the cleaned and neutralized exhaust air has the advantage of preventing a substantial energy loss, because the heat content of the cleaned and neutralized exhaust air is returned to the confined environment from which the exhaust air originated, rather than being lost to the ambient environment surrounding the confined environment of the establishment. Recirculating or returning the cleaned and neutralized exhaust air avoids the necessity to completely condition makeup air for the amount of the exhaust air that would normally be discharged into the ambient environment.

The recirculation duct 29 includes a vent 30 through which a small portion, for example about 20 percent, of the cleaned and neutralized exhaust air returning from the cleaner 20 is discharged into the ambient environment outside of the confined environment. Discharging a small portion of the cleaned and neutralized exhaust air assures that a small portion of the entire air within the restaurant will be replaced continuously with a comparable amount of fresh air. The continuous supply of a relatively small amount of fresh air is important in assuring an adequate oxygen content of the air within the confined environment of the food preparation establishment, because an aspect of the present invention is the consumption of oxygen in the air when neutralizing harmful gaseous contaminants, e.g. carbon monoxide, into neutralized or benign gases, e.g. carbon dioxide. Thus, discharging a small portion of the cleaned and neutralized return air through the vent 30 assures that a small amount of makeup air will continually deliver adequate oxygen into the interior of the restaurant.

Although the cleaned and neutralized return air could be returned directly into the interior of the confined environment of the restaurant, the cleaned and neutralized exhaust air can also be discharged into the hood 23. The hood 23 may be a conventional compensating hood 23, which is advantageously used for this purpose. The return exhaust air is directed by a compensating hood in a flowpath which causes the return air to traverse generally in a direction across the inlet to the hood 23. A significant portion of the delivered cleaned and neutralized exhaust air immediately reenters the exhaust flow leaving the hood 23 through the exhaust duct 25, thereby establishing a continual re-circulation path from the hood, through the cleaner 20 and blower 24 and back into the hood 23. Nevertheless, some of the cleaned and neutralized return air delivered from the recirculation duct 29 into the confined interior environment of the restaurant spills over into the food preparation area 21. Consequently, the cleaned and neutralized air discharged from the recirculation duct 29 must be capable of safe use and human consumption within the restaurant, even though a significant portion of that cleaned and neutralized air may again pass out of the confined environment without contacting or being consumed by humans.

Figure 2:
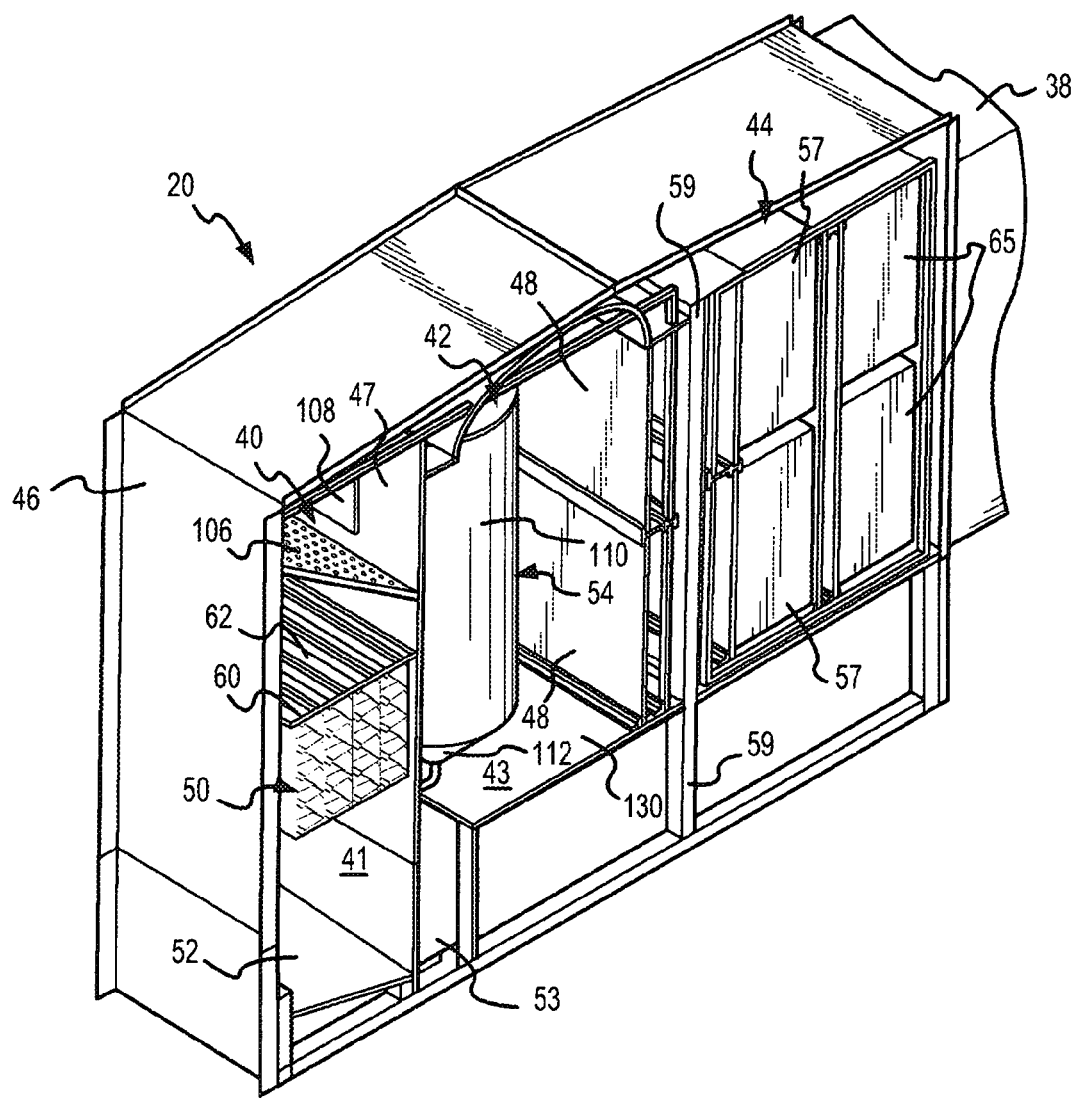
FIG. 2 is an enlarged perspective view of the cleaner shown in FIG. 1 with portions broken away to reveal a scrubber module, a liquid removal module and a filtering and conversion module of the cleaner.
Figure 3:
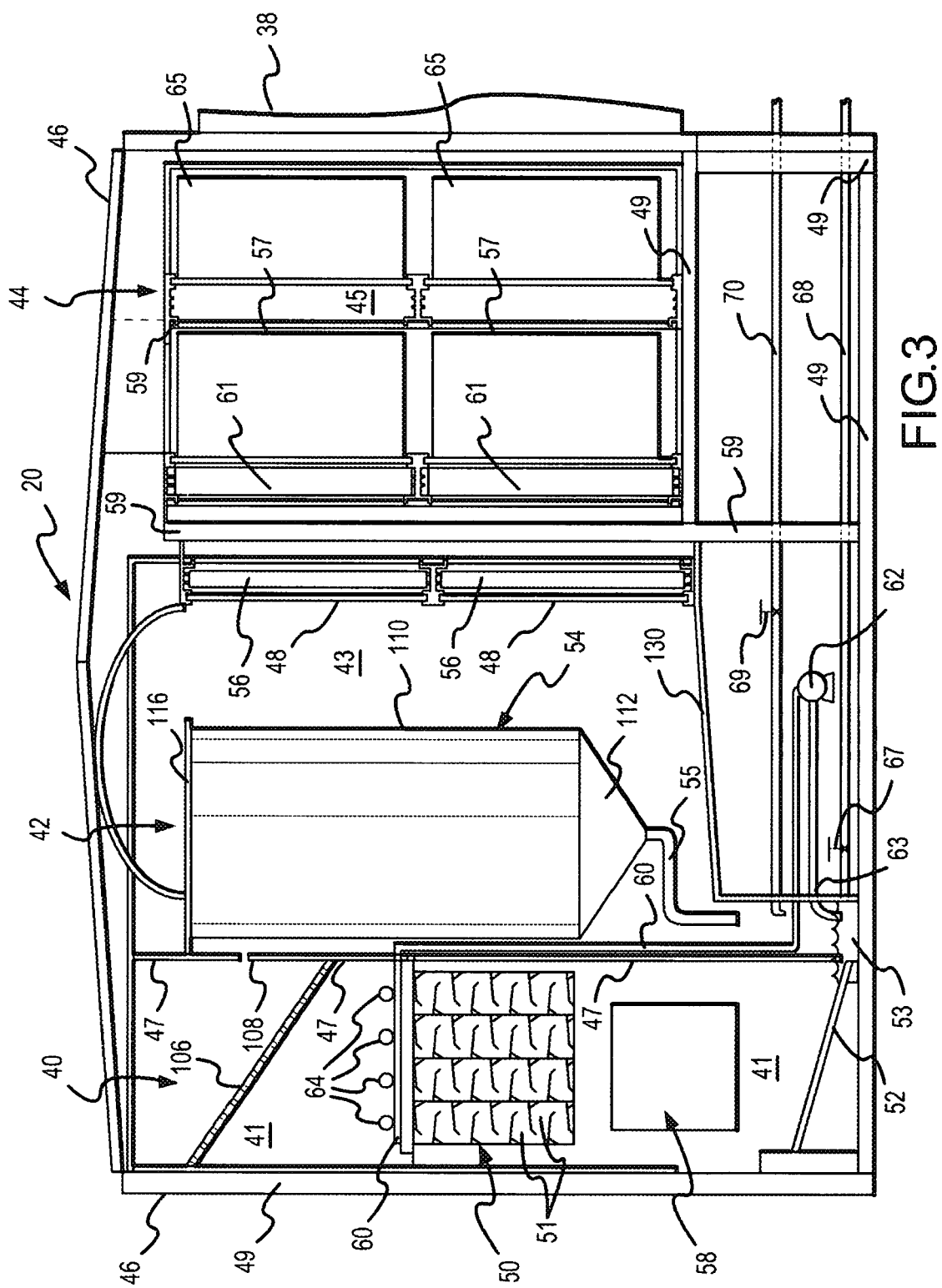
FIG. 3 is an enlarged side elevation view of the cleaner shown in FIG. 2.

The basic components of the cleaner 20 are shown in FIGS. 2 and 3. The cleaner 20 generally includes a scrubber module 40, a liquid removal module 42 and a filtering and conversion module 44. The three modules 40, 42 and 44 are contained within a scrubbing compartment 41, a liquid removal compartment 43 and a filtering and conversion compartment 45, respectively, of a housing 46 for the cleaner 20. The housing 46 includes side panels which define the exterior of the housing 46, and the side panels are removable to allow access to the interior of the cleaner and its components. An interior partition 47 separates the scrubbing compartment 41 from the liquid removal compartment 43, and interior diffuser plates 48, such as perforated steel plates, separate the liquid removal compartment 43 from the filtering and conversion compartment 45 within the housing 46. The cleaner housing 46 has an internal frame structure 49 which supports and positions the modules 40, 42 and 44, the housing side panels, the partition 47 and the diffuser plates 48, as well as the other components of the cleaner 20. A cleaner control and monitoring system (not specifically shown) is also preferably included within the cleaner, along with its sensors, to control and monitor the functions of the cleaner 20 and the modules 40, 42 and 44. Plumbing to conduct liquid and electrical conductors to supply power to the modules 40, 42 and 44, as described below, are also included within the cleaner 20.

The scrubber module 40 includes a baffle-defining structure 50. The baffle structure 50 creates a plurality of serpentine flow passageways 51 (FIGS. 4 and 6) through which water or other liquid cleaning agent cascades downwards while the exhaust air flows upwards. The resulting air/water mixing (or gas/liquid cleaning agent mixing) in the passageways 51 causes the particulate contaminants in the exhaust air to collide with and become entrained within the water, thereby removing the contaminants from the air passing upward out of the baffle structure 50. The entrained particulate contaminants drain with the water onto a sloped drain pan 52 at the bottom of the scrubber module 40, below the baffle structure 50. The water and entrained contaminants flow along the drain pan 52 and into a drain well 53. The configuration of the baffle structure 50 enhances the mixture of the flow and water and the atomization of the water into droplets, thereby improving the removal of particulate contaminants from the exhaust flow. The flow in the passageways 51 continues to the upper portion of the scrubbing compartment 41, above the baffle-defining structure 50, where the flow passes through a diffuser 106 and is conducted to the liquid removal module 42.

The liquid removal module 42 receives the flow discharged from the scrubber module 40 and removes liquid mist and additional contaminants. The liquid removal module 42 comprises a cyclone 54. The flow discharged from the scrubber module 40 into the cyclone 54 commences whirling at a relatively high speed, centrifugally forcing the water droplets and any remaining particulate contaminants to the outside of the cyclone 54. The small water droplets coalesce into larger amounts of liquid water and entrain contaminant particles forced to the outside of the cyclone 54. The water and entrained contaminants drain from the bottom of the cyclone 54 in a water exit conduit 55 which discharges into the drain well 53. The cleaned and dewatered air exits from the top of the cyclone 54 and is diffused by the diffuser plates 48 as it is routed from the liquid removal compartment 43 to the filtering and conversion module 44.

The filtering and conversion module 44 includes one or more mesh-like moisture filters or mist eliminators 56 for removing a portion of any remaining moisture droplets, one or more pre-filters 61 for removing any remaining large particulates, one or more high efficiency filters 57 (such as HEPA, DOP or BAG filters) for removing a portion of any additional fine particulates, and one or more gas-removing and volatile organic compounds-removing and converting catalytic cells 65. The filters 56, 57 and 61, and the catalytic cells 65 are connected to the support frame structure 59 in the filtering compartment 45. The filters 56, 57 and 61, and the catalytic cells 65 remove essentially all of the remaining residual moisture and any remaining particulate contaminates from the flow, and neutralize or convert gaseous components, such as carbon monoxide, and volatile organic compounds, into benign substances before the exhaust flow is conducted into the blower 24 (FIG. 1) and through the recirculation duct 29 into the restaurant. Because of the relatively high efficiency of the scrubber module 40 and the liquid removal module 42, both in removing contaminants and moisture, very little moisture or contaminants remain to be caught in the filters 56, 57 and 61 of the filtering and conversion module 44, thereby substantially reducing the frequency for changing or servicing the filters 56, 57 and 61. As is discussed below, the catalytic cells 65 contain heaters for periodically re-generating the effectiveness of the materials used within those catalytic cells, thereby also substantially reducing the frequency for changing or servicing the catalytic cells 65.

The scrubber module 40 of the cleaner 20 is described in more detail with reference to FIGS. 2-7. The exhaust flow from the hood 23 is supplied through the exhaust duct 25 to the cleaner 20 through an inlet 58 (FIG. 3) on a side panel of the housing 46, or through some other convenient access in the housing 46 into the scrubbing compartment 41 below the baffle structure 50 and above the drain pan 52. The generally vertically-oriented serpentine passageways 51 in the baffle structure 50 permit the air to flow upwardly through the baffle structure into a space in the scrubbing compartment 41 above the baffle structure 50.

Water or other cleaning liquid is distributed to the top and bottom of the baffle structure 50 through a pipe 60 which extends from a recirculating pump 62 (FIG. 3) having an inlet 63 which is connected to the drain well 53. The pipe 60 is connected to an open manifold distributor or closed tubing distributor 64 which extends above and below the passageways 51 in the baffle-defining structure 50. Although not shown, additional distributors 64 may be positioned along the length of the passageways 51 within the baffle structure 50 to assure that an adequate supply of water or other cleaning fluid is available throughout the entire length of the passageways 51. Nozzles 66 (FIGS. 4 and 6), jets or openings spray or distribute the water downwards across the full dimension of the passageways 51 (perpendicular to the view shown in FIGS. 4 and 6). The recirculating pump 62 pumps the water from the drain well 53 and supplies it to the pipe 60 which is connected to the manifold pipes 64 located at the top of the baffle structure 50. The water which drains downward through the passageways 51 of the baffle structure 50 falls onto the drain pan 52. The drain pan 52 slopes toward the drain well 53 and the pump 62. The partition 47 divides space above the drain pan 52 in the scrubbing compartment 41 from the drain well 53 in the liquid removal compartment 43, although a number of drain holes (not shown) are formed in the partition 47 at the level of the drain pan 52 to allow water and contaminants to drain from the pan 52 into the well 53. The drain holes in the partition 47 are below the water level of the drain well 53 so as to confine the substantial majority of the entering flow in the scrubbing compartment 41 and cause the flow to pass upwards through passageways 51 in the baffle structure 50.

The water drained into the well 53 is re-circulated from the drain well 53 by the pump 62 to the scrubber module 40. Some portion of the solid contaminants may settle to the bottom in the drain well 53 and are not re-circulated with the water from the top of the drain well 53. When the amount of contaminants entrained in the water becomes excessive, the cleaner will be flushed, either automatically by the control system or under manual control, to rinse out the contaminant buildup. Cleaning the cleaner is accomplished by opening a valve 67 on a drain pipe 68 (FIG. 3), and draining the water from the drain well 53. Simultaneously, or thereafter, a valve 69 on a water supply pipe 70 is opened, and the water in the drain well 53 is replaced with fresh water. The settled contaminants are flushed from the cleaner with the water drained from the drain well 53.

Alternatively, the scrubber module 40 need not re-circulate the water. Instead, the water could be delivered directly from the supply pipe 70 to the pipe 60 and into the manifold distributors 64, and the water collected from the drain well 53 would be drained through the drain pipe 68. The drain pipe 68 preferably includes a trap (not shown) to cause the drain pipe 68 to siphon the water out of the drain well 53 if the amount of water in the drain well 53 exceeds a predetermined level. Furthermore, because of water evaporation into the flow in the scrubber module 40, additional water may need to be added from time to time, by opening the water supply valve 69. The addition of the replenishing water may be accomplished either automatically by the control system or manually.

To assist in rinsing the baffle structure 50, a hot water delivery pipe (not shown) may be connected to spray hot water directly into the baffle structure 50. One or more chemical liquid cleaning agents may also be connected to periodically deliver liquid cleaning agent to the water used in the scrubber module 40 or as the entire cleaning liquid used in the scrubber module 40. In the event that corrosive chemicals need to be removed from the exhaust flow, or the cleaning agent is corrosive, the interior surfaces of the flow path in the cleaner should be coated or lined with an appropriate non-corrosive or non-reactive lining material.

Figure 4:
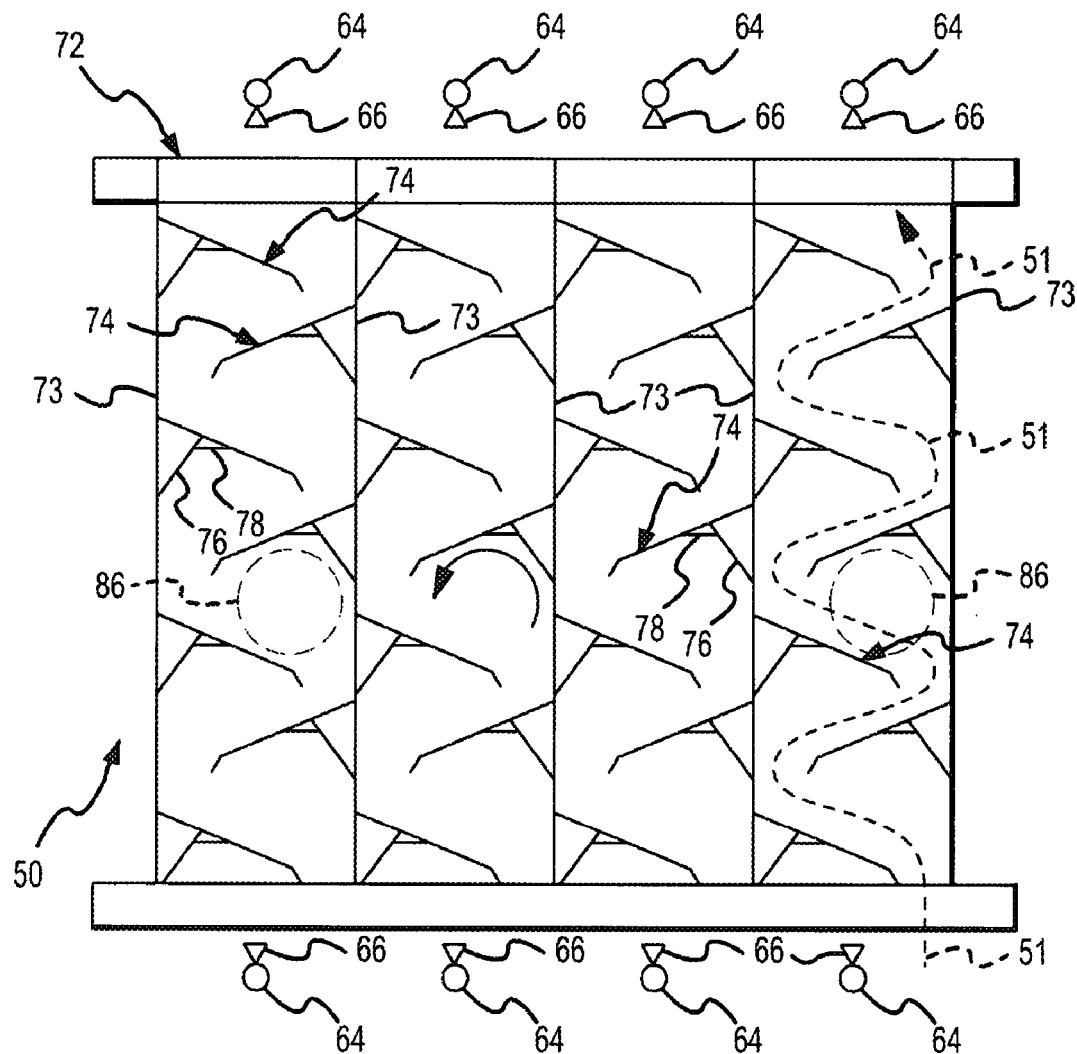
FIG. 4 is an enlarged side elevation view of a baffle-defining structure of the scrubber module of the cleaner shown in FIGS. 2 and 3.
Figure 5:
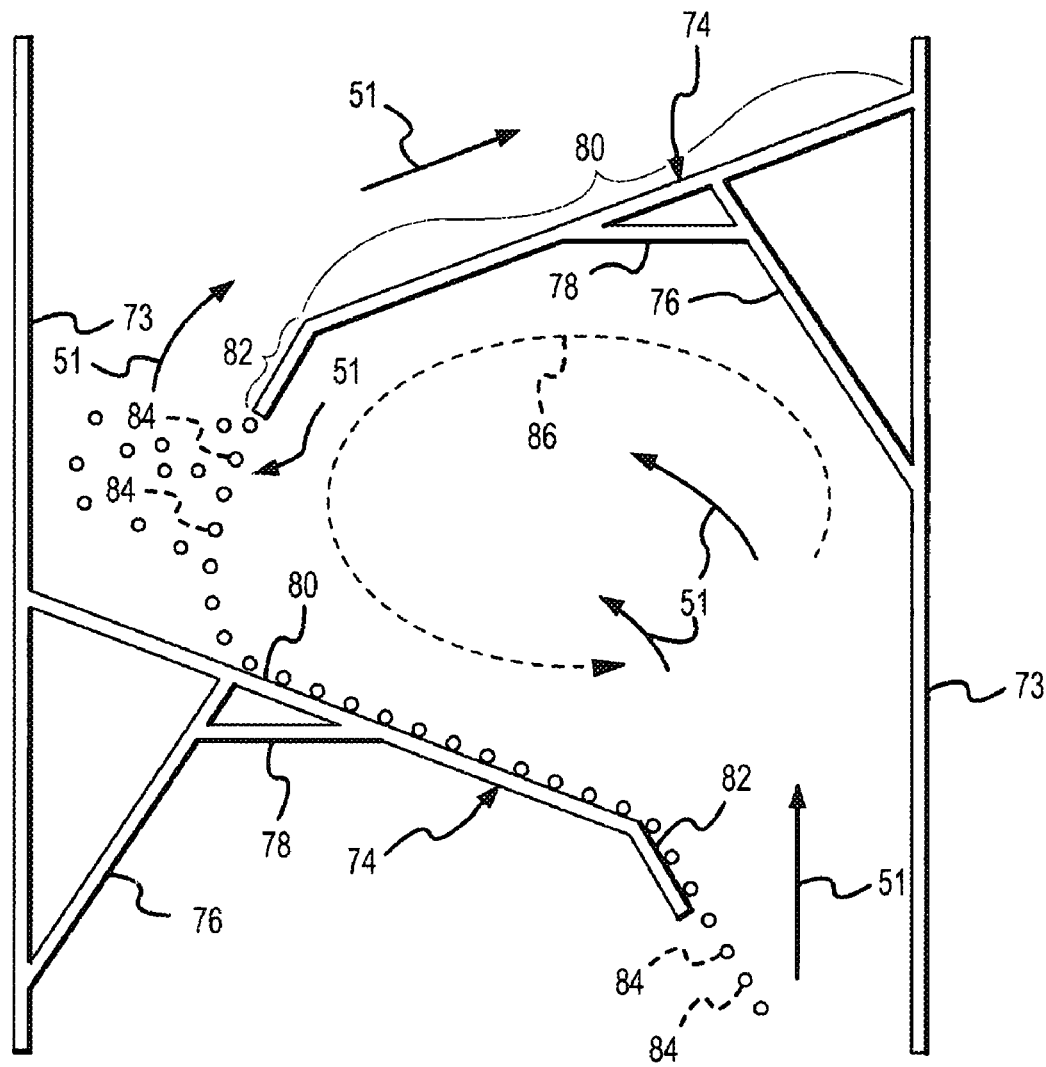
FIG. 5 is a further enlarged partial view of a portion of FIG. 4, illustrating flow turbulence and cleaning effects from the baffle-defining structure of the scrubber module shown in FIG. 4.

More details of one embodiment of 72 the baffle structure 50 are generally shown in FIGS. 4 and 5. The baffle structure embodiment 72 has multiple vertical sidewall plates 73 which are horizontally spaced apart from one another, which extend vertically from the top to the bottom of the baffle structure 72 and which extend horizontally (in a depth sense, perpendicular, as shown in FIG. 4) across the baffle structure embodiment 72. The sidewall plates 73 thereby divide the baffle structure embodiment 72 into the flow passageways 51.

Attached to each sidewall plate 72 at vertically spaced locations are deflection plates 74. The deflection plates 74 are positioned on the sidewall plates 73 so that one deflection plate 74 from one sidewall plate 73 projects into the space between two other deflection plates 74 attached to the other sidewall plate 73. Arranged in this manner, the deflection plates 74 overlap, causing an interdigitated arrangement of the deflection plates. This interdigitated arrangement establishes the serpentine shaped passageways 51 within the vertical space bounded by each pair of horizontally adjacent sidewall plates 73. Lower support brackets 76 and mid support brackets 78 strengthen and maintain the rigidity of the deflection plates 74, as well as help define the passageways 51. The deflection plates 74 and the support brackets 76 and 78 are connected to one another and to the sidewall plates 73 in a conventional manner, such as by welding in the case of metal or by an adhesive in the case of non-metallic material.

The major portion 80 of each deflection plate 74 is sloped downward at a low or moderate slope, such as about a 15 to 45 degree angle from the horizontal. An outer lip portion 82 of each deflection plate 74 is considerably shorter than the major portion 80 and is sloped downwards from the horizontal at a substantially greater angle, such as greater than 45 degrees.

Configured in the manner described, the interdigitated deflection plates 74 are substantially overlapped (about 51-80% overlapped). The relatively high degree of overlap causes the passageways 51 to be considerably serpentine. As a result, a relatively high degree of horizontal flow reversal occurs in the serpentine passageways 51 and causes improved interaction of the ascending air flow and descending water. The water and exhaust flow cannot avoid interaction and are forced into better mixing which results in improved contaminant removal, as is better understood by reference to FIG. 5.

Water which drains down from above accumulates on the top surfaces of the major portions 80 of the deflection plates 74 and drains off of the lip portions 82 where the water falls into the air flowing upwards through the passageways 51. Because of the complete overlap of the interdigitated deflection plates 74, the air flow must pass through a waterfall-like curtain of water falling from each lip portion 82, as shown at 84. Thus, it is not possible for the flowing air to escape contact with the water delivered from the lip portion 82 of each deflection plate 74, as would be the case if the deflection plates did not overlap.

An enhanced air/water mixing zone represented at 86 exists under each deflection plate 74, lower support bracket 76 and the mid support bracket 78, and above the next lower deflection plate 74. The underside surfaces of the lip portion 82, the exposed major portion 80, the lower support bracket 76 and the mid support bracket 78 deflect air and water that are flowing upwards generally in the rotational path represented at 86. The rotational path represented at 86 generally circumscribes and defines the enhanced air/water mixing zone. The lip portion 82, in particular, deflects the upward flowing air/water mixture back into the air/water mixing zone 86. The circulatory nature of the air flow in the mixing zone 86 suspends a considerable amount of water in a vortex, thus increasing the time that the water spends suspended in the air/water mixing zone 86 and maximizing the opportunity for contaminants to collide with and become entrained in or chemically react with the water.

The narrowness of the passageway 51 between the lip portion 82 and the sidewall plates 73 causes an acceleration of the flow in this region. Thus, as the water reaches the lip portion 82 of the deflection plate, the accelerating air causes some of the water in the waterfall-like curtain 84 to be buffeted upwards into the air/water mixing zone 86, rather than fall onto the next lower deflection plate. The relatively steep downward slope of the lip portion 82 of each deflection plate minimizes any surface tension adhesion of the water to the bottom of the deflection plate to inhibit any adhering water from moving up on the underside of the lip portion 82 against the force of the overall flow in the passageway 51 and against the force from the circulatory vortex in the mixing zone 86. The rapid flow at the end of the lip portions 82 also breaks the water drops in the waterfall-like curtain 84 into smaller droplets, thus increasing the surface area of the water droplets and finely dispersing the droplets to enhance the opportunity for collisions of the water droplets and the contaminants. The widening of the passageway 51 in the areas of the mixing zone 86 beyond (in the flow direction) the lip portions 82 of the deflection plates 74 assists in suspending the moisture in the mixing zone 86.

The configuration of the deflection plates 74 and the flow reversals in the serpentine passageway 51 increase the turbulence in the flow to enhance water droplet dispersion and to prevent the water from colliding with and draining down any of the surfaces in the passageways 51. Many smaller turbulent areas are also created in the passageways 51, forcing the water to mix with the air to provide more opportunities for contaminant removal.

The flow rate also contributes to the turbulence and air/water mixing efficiency in the passageway 51, since adjustment of the flow rate will cause more buffeting of the water into the air/water mixing zone 86 and more atomization of the water droplets. Also, the slopes of the major and lip portions 80 and 82, respectively, may be chosen to prevent the water, which lands on the top of the deflection plates 74, from draining too rapidly off the lip portion of the deflection plate 74, so that the water cannot fall quickly through the exhaust flow without being buffeted back up into the air/water mixing zone 86.

Figure 6:
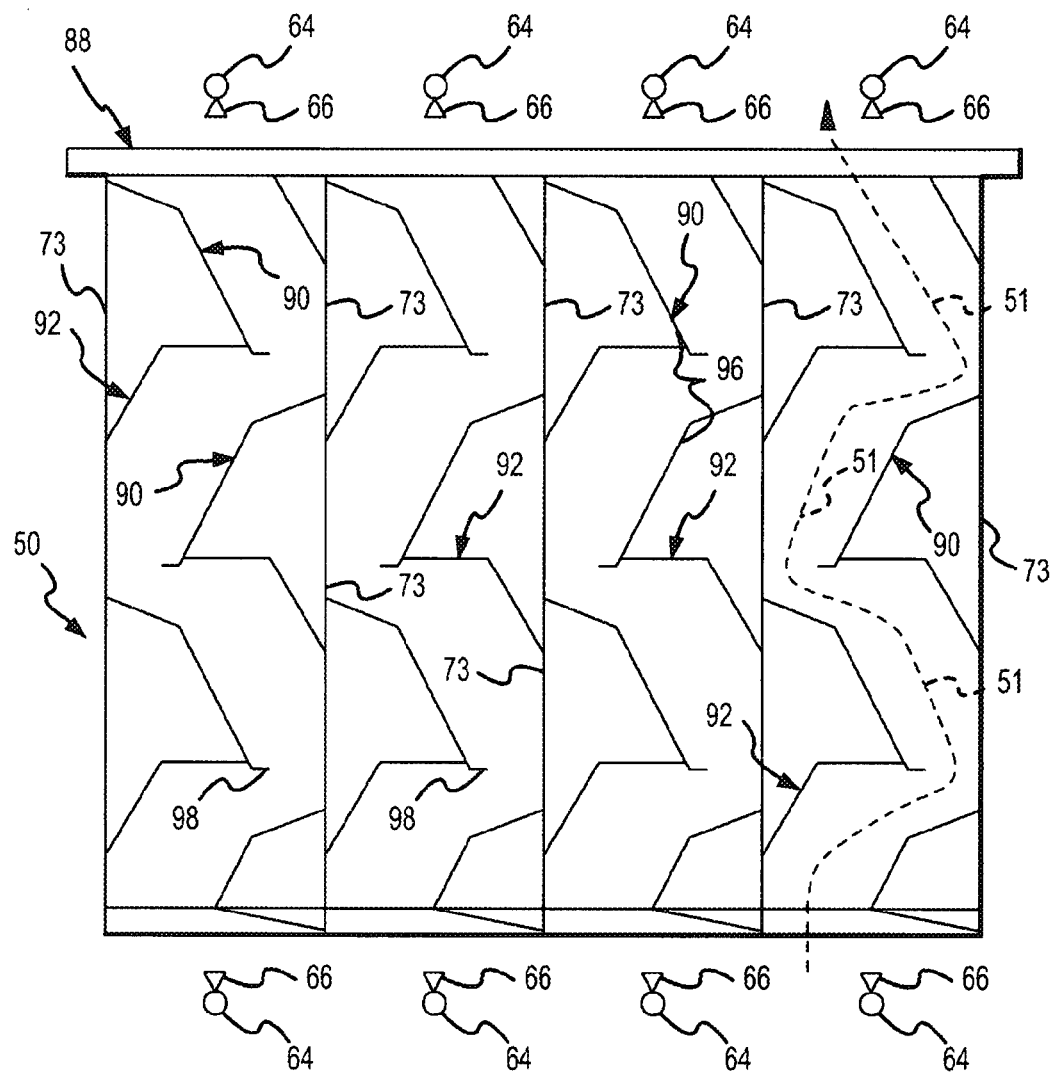
FIG. 6 is a side elevation view of an alternative configuration of the baffle-defining structure of the scrubber module shown in FIG. 4.
Figure 7:
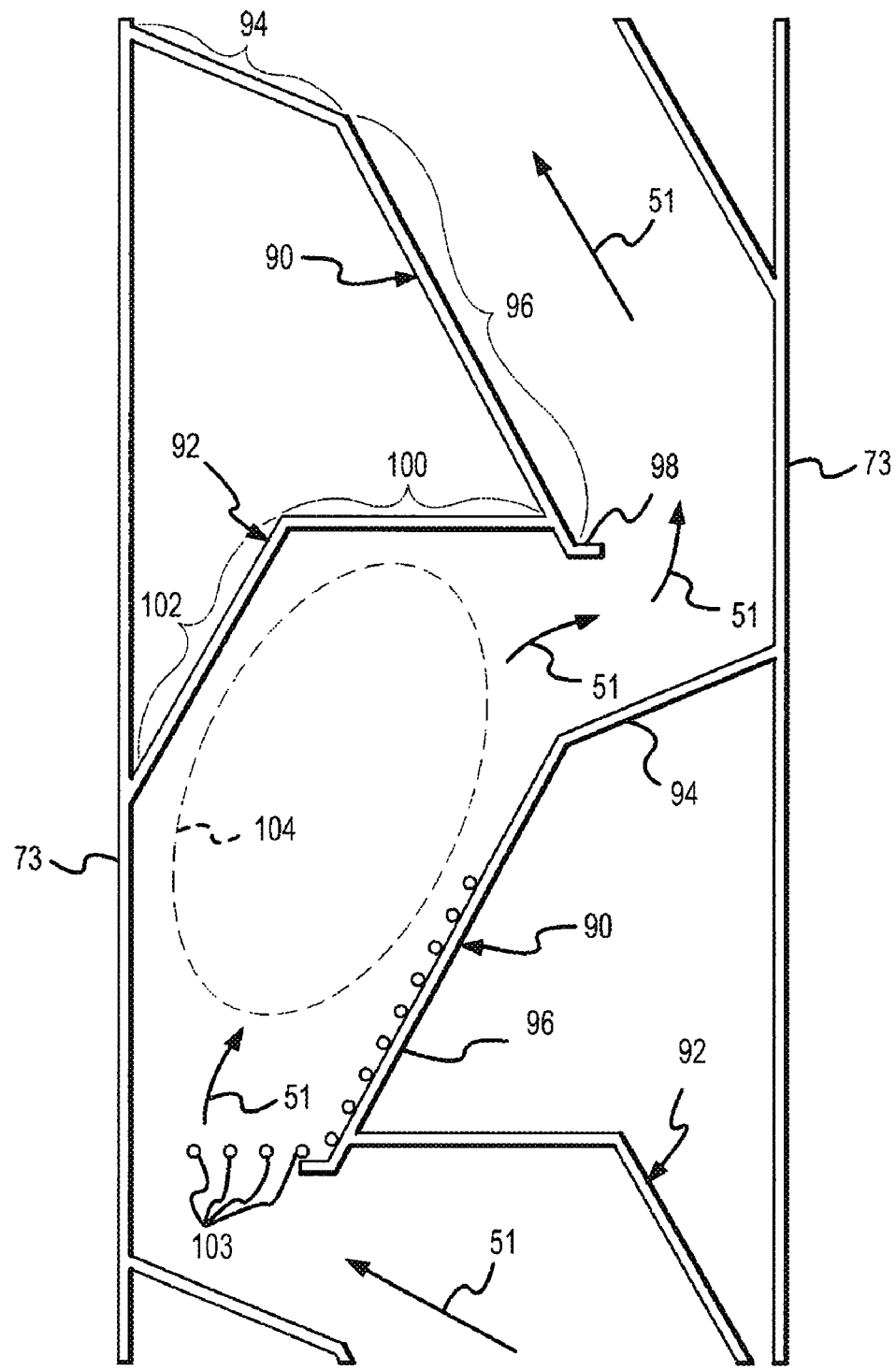
FIG. 7 is an enlarged partial view of a portion of FIG. 6 illustrating flow turbulence and cleaning effects from the scrubber module shown in FIG. 6.

An alternative embodiment 88 of the baffle-defining structure 50 is shown in FIGS. 6 and 7. The baffle structure embodiment 88 is similar to that embodiment 72 shown in FIGS. 4 and 5, except for the configuration of the deflection plates 90 which are employed in the embodiment 88. The configuration of the deflection plates 90 and the resulting shape of the flow passageway 51 are particularly well suited for handling high volume exhaust through the baffle-defining structure 50. The deflection plates 90, which project from the vertical sidewall plates 73 into each passageway 51, are vertically spaced from one another in each passageway 51, and interdigitate with one another in each passageway 51, in a manner similar to that previously described. A lower support bracket 92 connects to the deflection plate 90 and extends to the sidewall plate 73 to help define the passageway 51. Air flows generally upwards through passageways 51 and water flows generally downwards through passageways 51 while draining onto and being entrained in the flow shaped by the deflection plates 90.

Each deflection plate 90 includes a medium sized and downward angled upper portion 94, a largest sized and more steeply downwardly angled middle portion 96, and a smallest sized and horizontally extending outermost lip portion 98. Each support bracket 92 includes a generally horizontally extending outer portion 100 which connects at its outer end to the middle portion 96 slightly above the lip portion 98, and a relatively steeply inclined inner portion 102, which connects to the sidewall plate 73 and to the outer portion 100. The inner portion 102 extends at an inclination angle which is approximately parallel to the angle of the middle portion 96 of the deflection plate 90. The outer portion 1 00 extends substantially horizontally at a converging angle toward the upper portion 94 of the deflection plate 90 which is located slightly below and horizontally displaced from the outer portion 100. The deflection plates 90 and the support brackets 92 are connected to one another and to the sidewall plates 73 in a conventional manner, such as by welding in the case of metal or by an adhesive in the case of non-metallic material.

Because of the parallel relationship of the portions 96 and 102, a uniform cross section of the flow passageway 51 exists between these portions, and the flow through the portion of the passageway between these portions is more or less constant, except for turbulence induced upstream of this location. However, the converging nature of the portions 94 and 100 continually reduce the cross sectional size of the passageway, causing the flow rate therethrough to increase. The lip portion 98 projects into this portion of the flow passageway, which further reduces the size, and increases the flow rate. The slope of the middle portions 96 of the deflection plate 90 is high enough to cause water draining down onto the portion 96 to accelerate and shoot out almost horizontally from the horizontal lip portion 98 as shown at 103 (FIG. 7) into the increased-velocity flow adjacent to the lip portion 98 in the passageway 51. Because the passageway is reduced in size between the lip portion 98 and the sidewall plates 73, almost all of the water at 103 is buffeted upwards into an air/water mixing zone 104 above the lip portion 98 in the constant cross-section region between the portions 96 and 102.

Since the higher flow rate is sufficient to buffet almost all of the water at 103 into the air/water mixing zone 104, the baffle structure embodiment 88 shown in FIGS. 6 and 7 is not as dependent on a need to maintain the air and water in a major vortex 84 (FIGS. 4 and 5) to prevent the water from colliding with and draining down a side surface. Instead, any water that does collide with and drain down a side surface of the passageway 51 is quickly drained down to and directed entirely off of the lip portion 98 at 103, where the flow returns the water to the air/water mixing zone 104, maximizing the time that the water spends suspended in the air and maximizing the potential for contaminants to be removed by the water particles. Because there is no need for the vortex mixing zone 86 (FIGS. 4 and 5) the flow and volume handling of the baffle-defining structure embodiment 88 shown in FIGS. 6 and 7 is enhanced. In general, the baffle-defining structure embodiment 88 shown in FIGS. 6 and 7 obtains all of the previously described advantages of the baffle-defining structure described in FIGS. 4 and 5, at a higher flow volume.

The embodiments 72 and 88 of the baffle structure 50 allow the water and air to mix well enough to give the contaminants sufficient opportunity to collide with and become entrained within the water. The water sufficiently curtains the entire exhaust flow pathway, so there are no substantial regions where the contaminated flow avoids 5 contact with the water altogether.

The embodiments 72 and 88 cause the water to flow directly into the flow passageways 51 as the liquid flows off the lip portions 82 and 98 of the deflection plates 74 and 90, as shown in FIGS. 5 and 7 respectively. The flow buffets the water upward to cause air/liquid mixing zones whereby contaminants collide with liquid 10 droplets and become entrained therein or chemically react therewith. The considerable overlap of the deflection plates 74 and 90 causes flow reversals and ensures that the liquid must interact with the flow, rather than drain down the side walls, as is a problem in previous liquid cleaners. Each deflection plate 74 and 90 slopes downward a sufficient degree to launch the liquid droplets into the airstream, 15 rather than to allow the liquid droplets to adhere to the sidewalls. The deflection plates 74 and 90 are supported by underside brackets 76, 78 and 92 which further assist in defining the vortex mixing zone 86 and the mixing zone 104, shown in FIGS. 5 and 7, respectively, for better mixing of the liquid and the flow. The flow rate, or velocity, is selected to maintain an enhanced amount of liquid in the air/liquid mixing 20 zone, which again maximizes the opportunity for contaminant entrainment in the liquid.

The exhaust flow and entrained water which pass upward from the baffle-defining structure 50 contact an angled perforated plate 106, as shown in FIGS. 2 and 3. The perforated plate 106 serves as a gross water separating element in the flow 25 exiting the scrubber module 40 before the air flows into the liquid removal module 42. The perforated plate 106 permits the flow to pass therethrough, while evening out its distribution. The air flowing out of the top of the baffle structure 50 has a considerable airborne water content, and the perforated plate 106 removes some of the larger water droplets. The droplets carried in the air impact the perforated plate 30 and coalesce or collect into larger drops on the underside of the perforated plate 106. The collected water drains from the perforated plate 106 onto the partition 47 and from there drains back down through the baffle structure 50 to the drain pan 52. After the air passes through the perforated plate 106, it passes through a rectangular hole 108 in the partition 47 which separates the flow outlet of the scrubber module 40 from the exhaust flow inlet of the liquid removal module 42.

More details of the liquid removal module 42 are shown in FIGS. 2, 3, 8, 9 and 10. The cyclone 54 of the liquid removal module 42 is basically of a conventional configuration and includes a generally curved or cylindrically-shaped sidewall 110. A generally conical shaped bottom portion 112 is connected to the sidewall 110, and the relatively small water exit conduit 54 leads from the bottommost or pointed end of the conical bottom portion 112. A disc-shaped top end 116 is connected to the sidewall 110. A relatively large air exit conduit 118 extends through the top end 116. The air exit conduit 118 is axially positioned concentrically with respect to the cylindrical sidewall 110 and extends the length of the cylindrical sidewall from the top end 116 down into the conical bottom end portion 112. A lower end 120 (FIG. 9) of the air exit conduit 118 extends into the conical end portion 112 and is somewhat reduced in diameter and is spaced from the conical bottom portion. The air exit conduit 118 is held in position by its connection to the top end 116 and by braces (not shown) between the lower end 120 of the conduit 118 and the conical bottom end portion 112.

Figure 8:
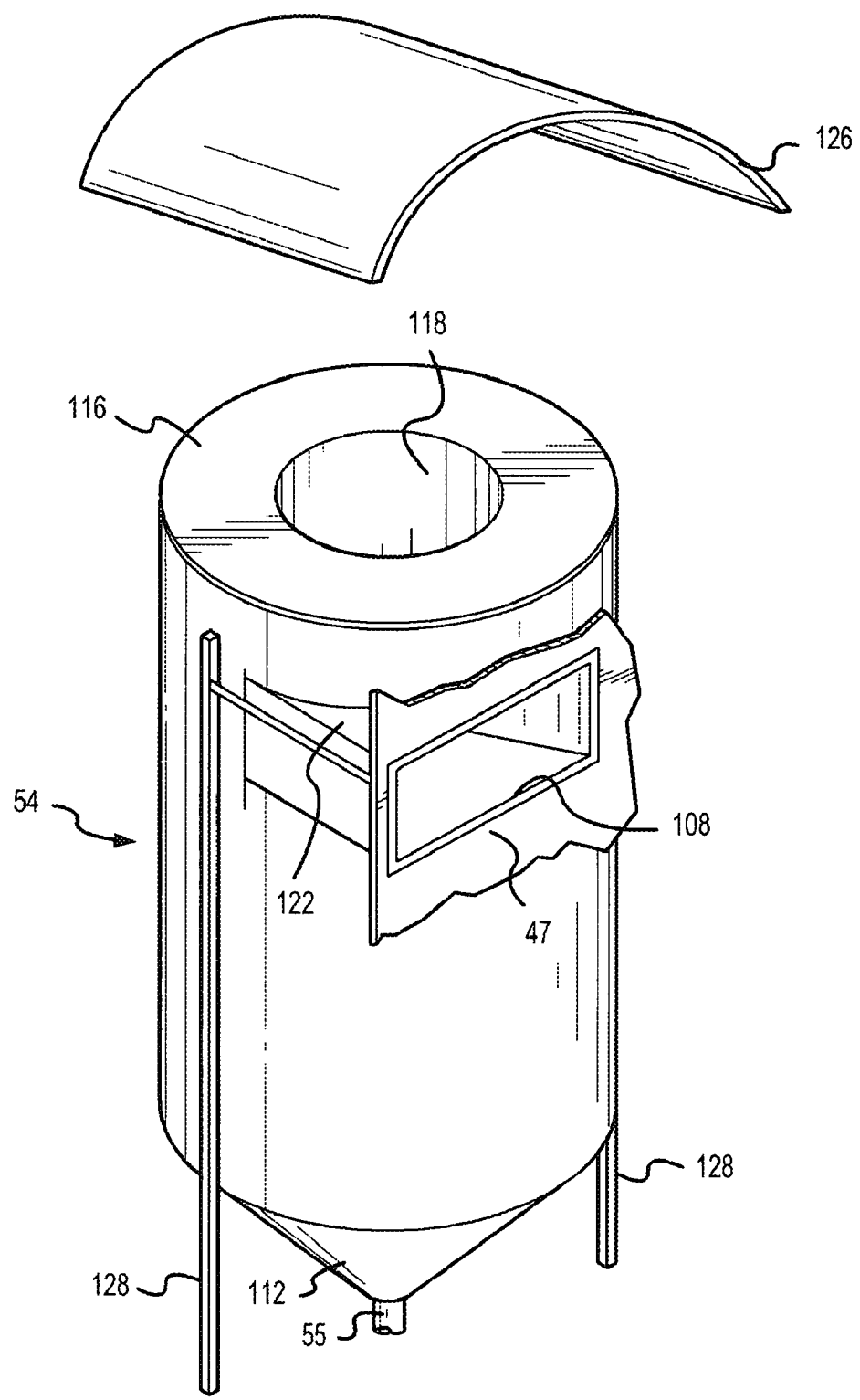
FIG. 8 is a perspective and exploded view of a cyclone of the liquid removal module of the cleaner shown in FIGS. 2 and 3, with portions also broken out for clarity of illustration.
Figure 9:
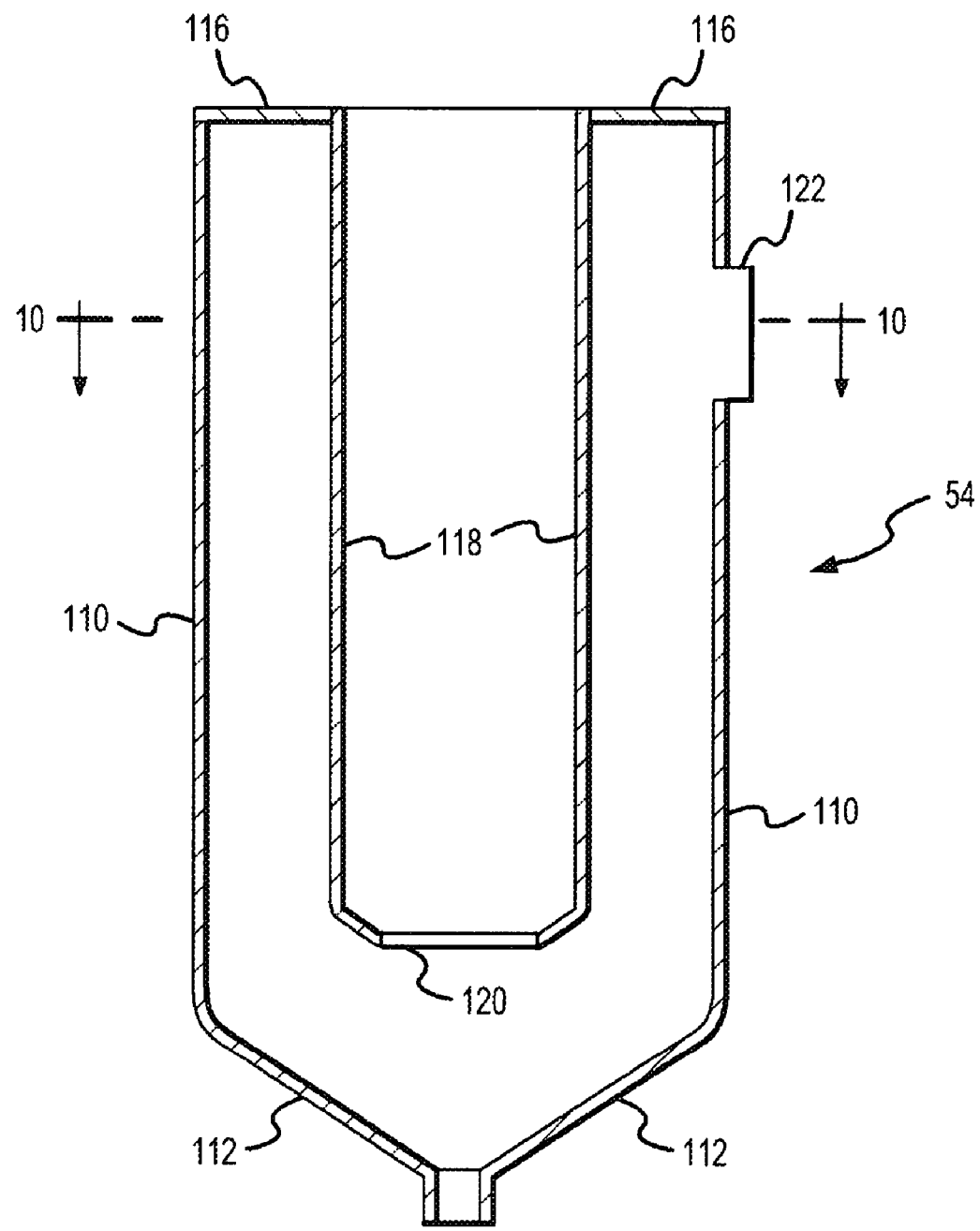
FIG. 9 is axially-sectioned side elevation view of a cyclone of the liquid removal module shown in FIG. 8.
Figure 10:
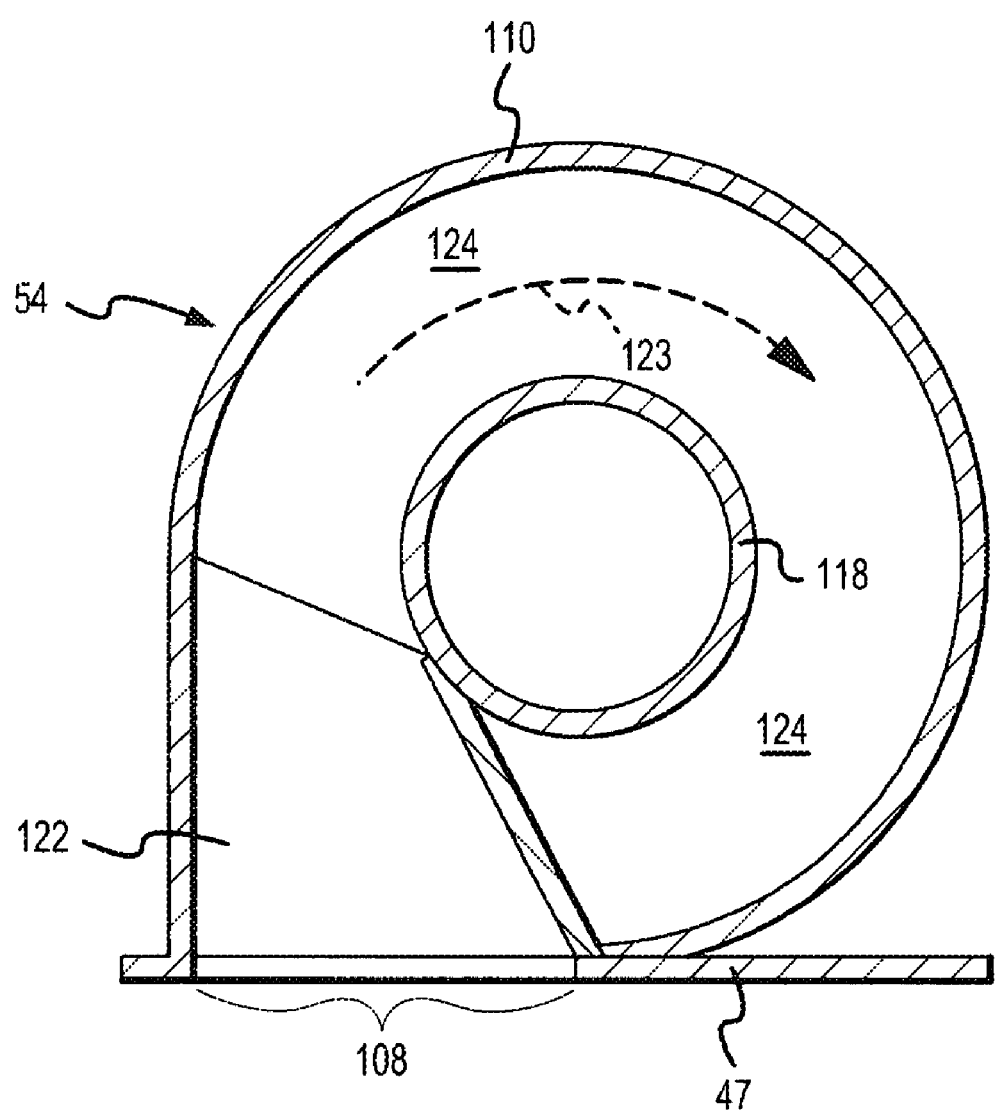
FIG. 10 is a cross-sectional view of the cyclone shown in FIG. 9, taken substantially in the plane of line 10-10.

A generally rectangular inlet duct 122 is connected to the rectangular hole 108 formed in the partition 47. The inlet duct 122 extends from the hole 108 in the partition 47 into the sidewall 110 near the top of the cyclone 54. The cross-sectional size of the inlet duct decreases slightly at the location where it joins the sidewall 110, as shown in FIGS. 8 and 10, thus causing the flow rate to increase as the air enters the cyclone 54. As shown in FIG. 10, the inlet duct 122 joins the cylindrical sidewall 110 tangentially, causing the accelerating flow entering the cyclone to initiate a circular swirling motion along the inside of the cylindrical sidewall 110 as shown by the flow arrow 123. A cyclonic whirling motion of the flow is created in the direction of arrow 123 within the cylindrical sidewall 110 in an annular space 124 defined by the inner surface of the sidewall 110 and the outer surface of the air exit conduit 118.

The downward spiraling flow in the annular space 124 experiences centrifugal force as a result of following the curved path of the sidewall 110. A common flow velocity for air flowing through the blower 30 (FIG. 1) may be about 1500 to 3600 linear feet per minute. The cyclone 54 will greatly increase (e.g. double) this linear velocity. The whirling air enters the open lower end 120 of the air exit conduit 118 after it has made multiple circuits around the sidewall 110 and flows up through the conduit 118 and exits from the cyclone at the open end of the conduit 118 at the top end 116.

The cyclonic whirling motion of the air in the annular space 124 causes the water mist particles in the air exiting from the scrubber module 40 to be forced under centrifugal force onto the inner surface of the cylindrical sidewall 110. The centrifugal force causes the small mist particles to coalesce into larger droplets. The droplets collect on and drain down the sidewall 110 into the conical bottom end portion 112 and from there into the water exit conduit 55. Some of any particles of contaminants that remain in the air after the water scrubbing process are also forced to the inner surface of the cylindrical sidewall 110, where those particles become entrained in the water and collected in the droplets which flow down and out of the cyclone 54. Thus, although the primary purpose of the cyclone is to remove water from the air which exits the scrubber module 40, the cyclone also achieves a level of contaminant removal as well. As shown in FIG. 3, the water exit conduit 55 is connected to drain into the well collection area 53, allowing the collected water to be reused in the scrubber module 40, in the manner previously described.

The liquid removal capability of the cyclone 54 offers a significant capability to remove moisture from the exhaust flow. Instead of depending upon meshes, perforated plates and slam walls to attempt to remove moisture from the flow exiting the cleaner, the baffle structure 50 and the cyclone 54 achieve an enhanced exhaust flow cleaning performance. In circumstances requiring less substantial cleaning, the cyclone 54 may be replaced with they serpentine flow duct having a series of 180 degree flow reversal elbows. The curved motion of the flow around each 180 degree flow reversal elbow causes the mist to coalesce on the outside curved surface of the elbow in much the same manner that the missed coalesces on the curved surface of the cyclone 54.

A curved air deflection baffle 126 is positioned above the open upper end of the conduit 118 (FIGS. 3 and 8), and directs the air exiting the conduit 118 from the top of the cyclone 54 over and down to the side of the cyclone 54 within the liquid removal compartment 43 (FIG. 3). The curved air deflection baffle 126 maintains the kinetic energy of the flow exiting the cyclone 54, without dissipating that flow energy by causing the flow to directly impact the sidewalls of the cleaner housing. The air deflection baffle 126 assists in directing the air throughout the compartment 43 where it diffuses through the diffusers 48. Various braces 128 (FIG. 8), the partition 47 and the cleaner frame structure 49 (FIGS. 2 and 3) support the cyclone 54 and its components and the air deflection baffle 126 within the cleaner housing 46.

Details of the filtering and conversion module 44 are shown in FIGS. 2, 3 and 11-12. The decontaminated and dewatered flow exiting from the cyclone 54 is guided by the curved deflection baffle 126 from the top of the cyclone into the flow diffusing portion of the liquid removal compartment 43, and from there through diffusion plates 48 and mist eliminators 56 of the filtering and conversion module 44 which are mounted on the support frame structure 59. Also connected to the support 59 downstream of the diffusion plates 48 and mist eliminators 56 are one or more pre-filters 61 and one or more conventional HEPA, DOP or BAG filters 57. The flow continues from the diffusion plates 48 and mist eliminators 56 through the filters 61 and 57 in the filtering compartment 45 and then through the catalytic cells 65 before passing out of an opening in the cleaner housing 46 into the duct work connecting the cleaner 20 to the blower 24 (FIG. 1).

Each mist eliminator 56 functions primarily as a fine demister to remove any residual amounts of water contained in the exhaust flow exiting the liquid removal module 42. The mist eliminators 56 are preferably conventional, using a fine mesh screen which removes the airborne water mist prior to passing the air through the filters 57. Any remaining mist in the air that collects on the diffusion plates 48 or mist eliminators 56 or on any of the housing sidewalls of the space inside of the liquid removal compartment 43 will drain down to a sloped drain surface 130 (FIGS. 2 and 3) within the liquid removal compartment 43 and from there into the drain well 53, where it may be re-circulated for use in the scrubber module 40. The pre-filters 61 are relatively low efficiency (25-40%) filters that are about two inches thick and made of porous fibers, such as fiberglass fibers, for removing any remaining large particles in order to protect the high efficiency filters 57 from unnecessary contamination. The high efficiency filters 57 are effective in removing very small contaminants and those which have resisted removal in the scrubbing and liquid removal modules.

By the time the air has passed through the filters 57, the cleaner 20 will have typically removed about 98% of the contaminants from the air, substantially better than the typical 40% efficiency of filtering devices used prior to the above-referenced invention. Of the total amount of the removed contaminants, the baffle structure 50 of the scrubber module 40 typically with have removed about 85%, the cyclone 54 of the liquid removal module 42 typically will have removed about an additional 10%, and the mist eliminators 56, pre-filters 61, high efficiency filters 57 typically will have removed approximately the remaining 3-5% of the particular contaminants. The baffle-defining structure 50 will typically remove almost all of the particles having a diameter greater than or equal to five (5) microns in addition to some smaller particles, while the liquid removal module 42 may remove almost all of the remaining particles greater than or equal to two (2) microns.

Certain types of molecular contaminants, such as odors, volatile organic contaminants and gaseous compounds may remain in the exhaust flow. Carbon monoxide and other toxic gases are lethal to humans in substantial amounts, and must therefore be removed or made benign before the exhaust air can be re-circulated into the confined environment. These chemical and gaseous substances will be substantially removed by the catalytic cells 65. The most prevalent type of gaseous substance contained in the exhaust flow exiting from the high efficiency filters 57 will be toxic carbon monoxide gas generated by burning hydrocarbon fuels. The catalytic cells 65 are effective in converting the carbon monoxide into benign carbon dioxide, while removing certain organic volatile compounds, odors and other gaseous contaminants.

The details of an exemplary catalytic cell 65 are shown and described in conjunction with FIGS. 11-13. Each catalytic cell 65 is formed by a plurality of individual cell panels 140 which are connected at their ends in alternating Vees as shown in FIG. 11. Each cell panel 140 includes a layer 142 of odor control particles 144, and a layer 146 of room temperature catalyst particles 148, as shown in FIG. 13. The odor control particles 144 of the layer 142 are preferably carbon particles. The odor control particles are effective in eliminating odors and organic volatile compounds as the flow passes through the layer 142 of odor control particles 144 in the cell panel 140. The catalyst particles 148 of the layer 146 may be conventional mixed manganese copper oxide (typically known as Hopcalite), which form a room-temperature catalyst to oxidize carbon monoxide to carbon dioxide. The hazardous carbon monoxide gas in the air which passes through the layer 146 of catalyst particles 148 is oxidized into benign carbon dioxide, as the exhaust flow passes through the layer 146 in the cell panel 140.

The layers 142 and 146 are held within a perimeter frame structure 150 of the cell panel 140, as shown in FIGS. 12 and 13. A center mesh-like divider 152 separates the layers 142 and 146. Outside screens 154 and 156 confine the odor control particles 144 and catalyst particles 148 within the cell panel 140. Spaces in the divider 152 and in the screens 154 and 156 permit the air flow through the cell panels 140. The particles 144 and 148 are packed within the cell panel 140 in the layers 142 and 146 with sufficient space around them to allow the air flow around and between those particles, so that the particles 144 and 146 can have their intended affect on the exhaust flow. The material for the perimeter frame 150, the divider 152 and the screens 154 and 156 is selected to be non-reactive to the odor control particles 144 and to the catalyst particles 148. Typically, this material may be polyvinyl chloride plastic material.

Occasionally the catalyst particles 148 must be renewed or reactivated to accomplish their catalyst function. This is performed by heating the catalyst particles 148 to a temperature of approximately 100 degrees Celsius. With the catalyst particles 148 heated to this temperature, any moisture absorbed in those particles is driven off and the chemical constituents of the particles are reactivated to perform their catalyst function. To heat the catalyst particles 148, an electrical heating element 158 is embedded in the layer 146, as shown in FIG. 13. The electrical heating element 158 is a conventional electrical resistive heating element which delivers heat to the surrounding catalyst particles 148 when electrical current is conducted by the heating element 158. The heat from the heating element 158 is also beneficial in driving off any moisture which may accumulate on the odor control particles 144.

The control system of the cleaner 20 (not shown) conducts the electrical current through the heating element 158. Electrical current is supplied to the heating element 158 by a connector (not shown) located on the perimeter frame 150. The connector on the perimeter frame 150 connects with a corresponding connector located within the frame 46 of the cleaner 20.

The individual cell panels 140 are held in the Vee shape orientation shown in FIG. 11 by conventional mechanical connectors and supports, not specifically shown. The joints and spaces between the cell panels 140 are sealed to confine the flow through the layers 142 and 146 of the cell panels 140. Preferably the sealant between the cell panels 146, and the support and connectors of the frame 46 is a suitable resilient sealing material, such as conventional biomed gel used as a sealant in clean rooms. An example of such clean room biomed gel is CRG 246 manufactured by Gordon Clean Room Products of Shreveport, La. Such a biomed gel forms a complete, durable and reusable non-toxic and non-contaminating seal which conforms around the edges and surfaces of the cell panels 140 which it contacts. Moreover, such a biomed gel releases from the edges and surfaces of the cell panels 140 if it becomes necessary to replace or service those cell panels. The biomed gel thereafter re-conforms around any replacement cell panel to form a complete, integral seal.

Each Vee shaped configuration of two cell panels 140 (three Vee shaped configurations are shown in FIG. 11) is defined in part by an end panel 160 which is connected to the perimeter frames 150 of the two cell panels 140 oriented in the Vee shaped configuration. Each end panel 160 is connected to the pair of cell panels 140 in an airtight manner, such as with a mechanical connector or with biomed gel. Each end panel fits within slots or receptacles in the frame 46 to hold its position and to confine the flow over and through the cell panels 140.

The control system of the cleaner 20 is preferably computer-controlled. The control system includes a plurality of sensors located at selected points in the flow through the cleaner 20 for monitoring the contaminant removal, water level and liquid removal functions. Further sensors are connected to various active elements of the cleaner to control the operation of the cleaner for desired performance conditions. For example, the control system monitors the flow rate or speed in order to determine whether the blower 24 (FIG. 1) is functioning properly, or if the flow path has become obstructed, or the speed of the blower needs adjusting. The control system also monitors the amount of water in the baffle-defining structure 50 to determine whether the amount of water flowing through and confined within the mixing zones (86, FIG. 5 and 104, FIG. 7) of the baffle structure is at the desired level. If not, the speed or performance of the pump 62 (FIG. 3) is adjusted. To control the amount of water suspended in the mixing zones, an infrared (IR) source/detector (not shown) is mounted within an air passageway 51 of the baffle structure 50 to detect the amount of water therein. The control system also monitors the water level in the drain well 53 and delivers additional water when needed through the water supply pipe 70 by controlling the valve 69 (FIG. 3). The control system also monitors the amount of contamination in the diffusion plates 48, the mist eliminators 56 and the filters 57 to determine when to replace or clean these elements and to signal that these elements need servicing. The control system also times the time period for heating, and the time intervals between heating, the cell panels 140 of the catalytic cells 65 to keep the catalyst particles 148 activated. The control system controls valves to periodically drain the contaminated water from the drain well 53 and to refresh the well 53 with clean water, as well as to wash out the scrubber module 40 and cyclone 54. Many other control functions may also be performed by the control system.

In addition to removing and neutralizing odors, volatile organic compounds and toxic gas by the catalytic cell 65, some odors, volatile organic compounds and gaseous constituents may also be removed by the addition of chemical emulsifiers or attractants in the water or cleaning liquid of the scrubber module 40. Alternatively, the water in the scrubber module 40 may be replaced entirely with a cleaning liquid agent to chemically react with the airborne contaminants to capture and remove the contaminants and/or to convert the contaminants into a harmless substance. Thus, the liquid flowing through the scrubber module may be any appropriate liquid or liquid mixture determined by the particular content of the contaminants.

The volumetric capacity of the cleaner 20 may be adjusted to accommodate various different requirements for exhaust flow volumes and contaminant concentrations. The baffle-defining structure 50 is preferably made in modularized form, allowing multiple baffle structures 50 to be organized into a larger baffle-defining collection 132 formed by placing individual baffle structures 50 side-by-side in a width dimension, on top of one another in a height dimension, and end to end in a depth dimension to create more, longer and wider flow passageways, respectively. Increasing the number, length and width of the passageways 51 by increasing the number of baffle-defining structures 50 may require a change in the size of the housing 46 (FIG. 1). The housing and its internal frame are formed with rails and projections (not shown) which allow the baffle-defining structures 50 to be conveniently inserted into the housing and removed from it once side panels of the housing are removed.

The cleaner 20 may include more than one liquid removal module 42, or more than one cyclone 54 in each liquid removal module, arranged in parallel in the exhaust flow path. The number of cyclones and liquid removal modules is adjusted according to the volumetric capacity of the cleaner. Similarly, as many catalytic cells 65 and cell panels 140 may be incorporated into the cleaner 20 as needed to accommodate the volumetric capacity of the particular application. More than one cleaner 20 may be arranged in parallel if necessary to accommodate a particularly large exhaust flow. However, in most cases, a single scrubber module 40, liquid removal module 42 and filtering and catalytic module 44 would generally prove satisfactory for most typical applications.

The cleaner described above provides several improvements and advantages over previous cleaners, including high efficiency in water scrubbing the contaminants from the exhaust flow by the enhanced air/water mixing conditions created by the scrubber module, high efficiency in removing the mist and residual particles from the air by the centrifugal force by the liquid removal module, and effective filtration and conversion of odors, volatile organic compounds and hazardous gaseous constituents into benign substances which allow the substantial majority of the clean exhaust air to be recirculated into the restaurant or other clean air environment. By being able to recirculate the substantial majority of the exhaust air, the thermal energy of that exhaust air is not lost by discharge into the ambient environment. Instead, the thermal energy may be returned to the confined environment, thereby reducing the costs and requirements to condition makeup air. Although a small amount of the oxygen within the air is used in oxidizing carbon monoxide to carbon dioxide, that amount of oxygen is made up as a result of discharging a small proportion of the clean exhaust air into the ambient environment. The small amount of the discharged clean exhaust air is made up by fresh air containing sufficient oxygen so as not to deplete the confined environment of oxygen. Many other advantages and improvements will be apparent to those having skill in the art, after gaining a complete understanding and comprehension of the present invention.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiment set forth above.

The invention claimed is:

1. A method of recirculating cleaned and neutralized air into a confined environment to retain a substantial portion of a thermal energy content of the air which was originally drawn from the confined environment as part of an exhaust flow which contains gaseous carbon monoxide contaminants and particulate contaminants, the method comprising:

establishing the exhaust flow of the air and contaminants from within the confined environment, the air of the exhaust flow having the thermal energy content;

liquid scrubbing the particulate contaminants from the exhaust flow;

moving the flow in a curved path to force liquid mist introduced into the flow by the liquid scrubbing to coalesce into liquid by centrifugal force caused by moving the flow in the curved path;

removing the coalesced liquid from the flow;

removing odor from the flow after the coalesced liquid has been removed;

catalytically converting the carbon monoxide gaseous contaminants in the flow into benign carbon dioxide gaseous constituents after the coalesced liquid has been removed;

retaining a substantial portion of the thermal energy content of the air withdrawn from the confined environment while liquid scrubbing the contaminants, coalescing the liquid mist, removing the liquid, removing the odor and catalytically converting the carbon monoxide gaseous contaminants into benign carbon dioxide gaseous constituents; and discharging the flow with the retained thermal energy content back into the confined environment after the particulate contaminants have been removed, odor has been removed and the carbon monoxide gaseous contaminants have been catalytically converted into the benign carbon dioxide gaseous constituents.

2. A method as defined in claim 1, further comprising:

catalytically converting the carbon monoxide gaseous contaminants into the benign carbon dioxide gaseous constituents at approximately room temperature.

3. A method as defined in claim 2, further comprising:
using a room-temperature catalyst to catalytically convert the carbon monoxide gaseous contaminants into the benign carbon dioxide gaseous constituents; and
periodically heating the room-temperature catalyst to a predetermined temperature greater than room temperature which is sufficient to regenerate catalytic characteristics of the catalyst.

4. A method as defined in claim 1, wherein the confined environment is a food preparation establishment having an open flame cooker which produces carbon monoxide gas and odor as gaseous contaminants, and smoke and airborne grease as particulate contaminants in the exhaust flow, further comprising:

collecting the exhaust flow in a collection hood located over the open flame cooker to establish the exhaust flow from within the confined environment;

cleaning substantially all of the particulate contaminants from the exhaust flow by liquid scrubbing after collecting the exhaust flow in the collection hood; and catalytically converting the carbon monoxide gas and air in the exhaust flow into carbon dioxide gas after the liquid scrubbing.

* * * * *